United States Patent [19]

Fusegawa et al.

[11] Patent Number: 5,306,387
[45] Date of Patent: Apr. 26, 1994

[54] METHOD FOR PULLING UP SEMICONDUCTOR SINGLE CRYSTAL

[75] Inventors: Izumi Fusegawa; Hirotoshi Yamagishi, both of Annaka, Japan

[73] Assignee: Shin-Etsu Handotai Co., Ltd., Tokyo, Japan

[21] Appl. No.: 713,848

[22] Filed: Jun. 12, 1991

[30] Foreign Application Priority Data

Jun. 21, 1990 [JP] Japan .................. 2-163891

[51] Int. Cl.5 ............................. C30B 15/22
[52] U.S. Cl. .................. 156/618.1; 156/617.1; 156/620.4; 422/249
[58] Field of Search ............ 156/601, 617.1, 618.1, 156/619.1, 620.4; 422/249

[56] References Cited

U.S. PATENT DOCUMENTS

| | | | |
|---|---|---|---|
| 3,929,557 | 12/1975 | Goodrum | 156/617.1 |
| 4,659,423 | 4/1987 | Kim et al. | |
| 4,830,703 | 5/1989 | Matsutani | 156/617.1 |
| 4,849,188 | 7/1989 | Takasu et al. | 156/617.1 |

FOREIGN PATENT DOCUMENTS

| | | | |
|---|---|---|---|
| 0194051 | 11/1986 | European Pat. Off. | |
| 0247297 | 3/1987 | European Pat. Off. | |
| 0285943 | 10/1988 | European Pat. Off. | 156/617.1 |
| 0285943A | 3/1989 | European Pat. Off. | |
| 0081086A | 10/1983 | Japan | |
| 60-33291 | 2/1985 | Japan | |
| 2191113A | 4/1987 | United Kingdom | |

OTHER PUBLICATIONS

Journal of Crystal Growth; vol. 96, No. 4, Aug. 1989, pp. 747–755; Hirata, et al; "Silicon Crystal Growth In A Cusp Magnetic Field".
IBM Technical Disclosure Bulletin, vol. 26, No. 11, Apr. 1982, pp. 5790–5791; Kim, et al.; "Control of Oxygen Segregation In Czochralski . . . ".
Applied Physics Letters, vol. 50, No. 6, Feb. 1987; pp. 329–331; Ozawa, et al; "Programmed Nagentic Field Applied Liquid Encapsulated Czochralski . . . ".
Journal of Applied Physics; vol. 50, No. 7, Oct. 1985; pp. 2731–2735; Kim, et al.; "Striations in CZ Silicon Crystals Grown Under Various Axial . . . ".
Solid State Technology; vol. 33, No. 4, Apr. 1990; pp. 163–167; Thomas, et al; "Melt Grown of Large Diameter Semiconductors: Part II".
Research: "Getting Holes Out of Silicon Chips"; Sony Corp.
Electronics: "Magnetic Field Breeds Skylab-like Semiconductors"; Cohen, (1980) pp. 83–84.

Primary Examiner—Olik Chaudhuri
Assistant Examiner—Felisa Garrett
Attorney, Agent, or Firm—Ronald R. Snider

[57] ABSTRACT

A semiconductor single crystal rod having a controlled oxygen concentration distribution in the direction of length is produced by method of pulling up a semiconductor melt held in a quartz glass crucible under application of a magnetic field, which method is characterized by fixing the rotational speed of said quartz crucible at a level exceeding 5 rpm and varying the intensity of said magnetic field applied to said molten semiconductor according to the length of pull of said single crystal rod.

10 Claims, 6 Drawing Sheets

LENGTH OF PULL-UP OF THE SINGLE CRYSTAL ROD (cm)

METHOD FOR PULLING UP SEMICONDUCTOR SINGLE CRYSTAL

BACKGROUND OF THE INVENTION

1. Field of the Invention

This invention relates to a method for the growth of a semiconductor single crystal by the procedure of bringing a seed crystal into contact with a molten semiconductor held in a quartz crucible and pulling up a rod of semiconductor single crystal from the molten semiconductor. More particularly, this invention relates to a method for the growth of a semiconductor single crystal characterized by conferring a prescribed distribution upon the oxygen concentration in the direction of pull of the semiconductor single crystal by the adjustment of the intensity of the magnetic field applied to the molten semiconductor.

2. Description of the Prior Art

In the growth of a single crystal of silicon by the Czochralski method (CZ pull method), a quartz ($SiO_2$) crucible is used as the container for holding molten silicon. It has been known that the grown single crystal of silicon contains a fairly large amount of oxygen because the silicon at the melting point is chemically active and, therefore, is suffered to react with the quartz of the crucible and melt it into the molten silicon. When the quartz of the crucible melts into the molten silicon, the trace of impurities present within the crucible proper simultaneously melt out and find their way into the grown single crystal of silicon.

The oxygen in the single crystal of silicon, depending on the concentration and distribution thereof, manifests various effects on the characteristics of a semiconductor device made from the single crystal or on the heat treatment performed on the device during the course of production. When the oxygen concentration is relatively high, for example, the heat treatment induces a stacking fault or produces precipitates of oxygen and exerts adverse effects on the characteristics of the semiconductor device.

Incidentally, when the heat treatment is performed with the fault of this nature lodged outside the active region of the semiconductor device, it gives birth to the so-called intrinsic gettering action, namely the action of gettering harmful impurities such as, for example, impurities of such metal as Fe, Cu, and Au, and brings about an effect of improving the characteristics of the semiconductor device.

When the oxygen concentration is high but not to the extent of inducing the occurrence of precipitate of oxygen, it is effective in curbing the occurrence and growth of defects due to oxygen clusters. To be specific, it is capable of repressing the occurrence and growth of defects during the heat treatment performed in the course of the production of the semiconductor device.

This state of affairs has urged the development of techniques for allowing the oxygen in the single crystal of silicon to be distributed at a relatively high level such as, for example, in the range of from 15 to 20 ppma as uniformly throughout the entire length thereof as permissible. Japanese Patent Publication SHO 60(1985)-6,911, for example, discloses a method which, in the step of pulling up a single crystal rod from a molten semiconductor material held in a quartz crucible by the Czochralski method, controls the gradient of the rotational speed profile of the crucible in inverse proportion to that of the axial oxygen concentration of the crystal during the pulling process.

Then, Japanese Patent Application Disclosure SHO 57(1982)-135,796 discloses a method which comprises rotating a seed crystal of silicon grown in size to be pulled up about its axis in the direction opposite that of the rotation of a crucible holding a molten semiconductor at an initial rotational speed greater that of the crucible and increasing the rotational speed of the crucible in accordance as the volume of the molten semiconductor held in the crucible decreases These methods, however, have the disadvantage that the convection of the molten semiconductor for crystal growth and the vibration of the surface of the molten semiconductor result in conspicuous occurrence of swirly defects and striation of growth and the rotation of the crucible coupled with the convection entails forced current and vortex current within the molten semiconductor and, as a result, the oxygen concentration is varied in a fairly wide range in the direction of the length of pull.

For the purpose of mending this disadvantage, there has been proposed a method for the growth of crystal which, during the operation of pulling up a single crystal from a molten semiconductor while keeping the molten semiconductor under application of a magnetic field and keeping in rotation the container of the molten semiconductor, controls the oxygen concentration in the single crystal by varying the rotational speed of the container [Japanese Patent Application Disclosure SHO 58(1983)-74,594].

This method is capable of curbing the occurrence of swirly striation of growth and effecting the control of oxygen concentration, though to a limited extent.

The attempt at controlling the oxygen concentration by adjusting the rotational speed of the crucible nevertheless entails the disadvantage that the oxygen concentration distribution in the direction of pull of the single crystal is still varied in a fairly wide range. By the control of the revolutionary speed of the crucible, however, accurate control of the oxygen concentration within ±5 to 10% in the direction of pull of the single crystal has never been successfully attained.

SUMMARY OF THE INVENTION

This invention aims to overcome these disadvantages and has as an object thereof the provision of a method which comprises pulling up a single crystal rod of silicon while accurately controlling the oxygen concentration in the direction of length of pull thereby producing a single crystal rod of semiconductor having a high oxygen concentration substantially exceeding 15 ppma throughout the entire length of the grown single crystal, having the oxygen concentration distributed in a prescribed gradient in the direction of length of pull of the single crystal and, when the oxygen concentration distribution is uniform, exhibiting accuracy of control within ±5 to 10%.

Figure 1:
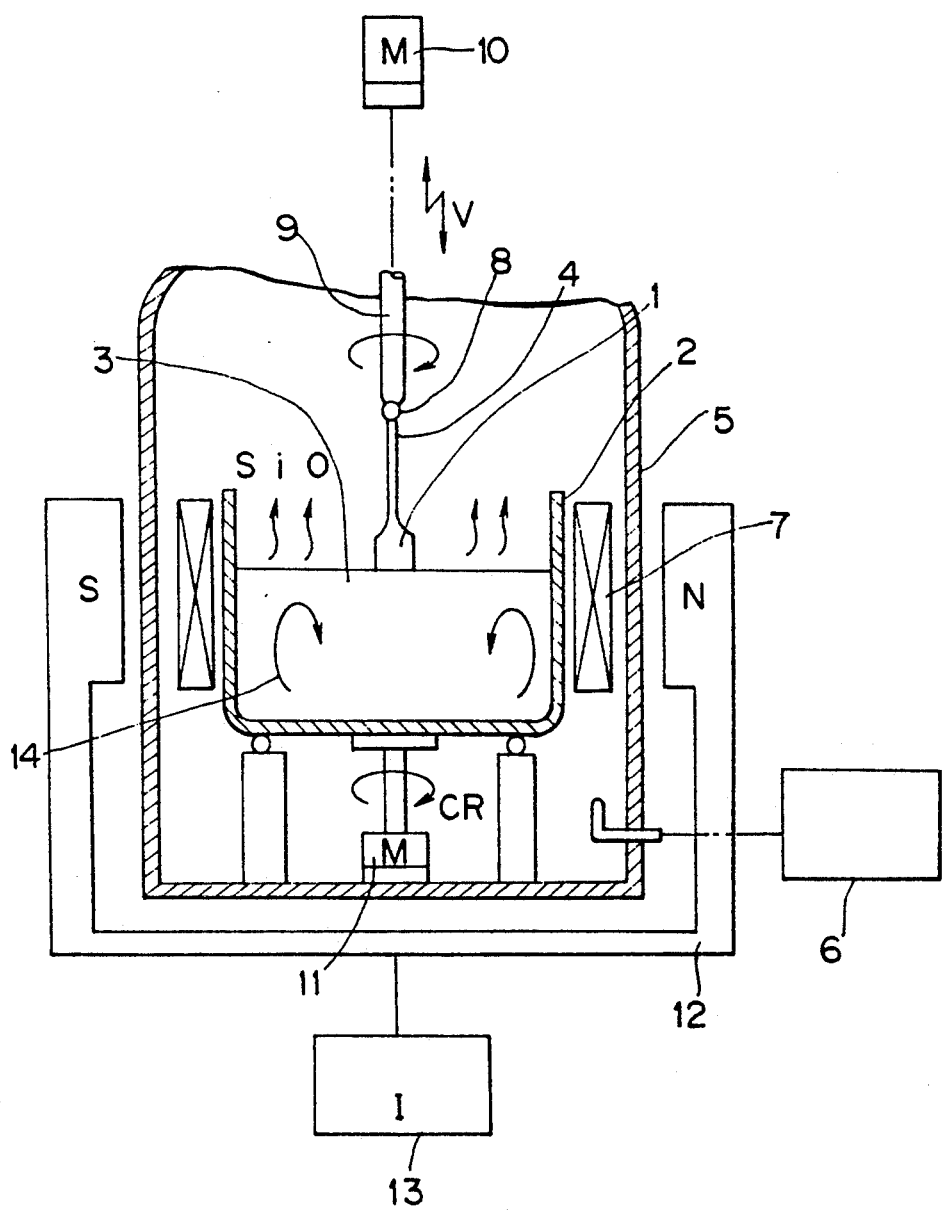
FIG. 1 is a partial cross section schematically illustrating the construction of an apparatus to be used for working the method of this invention.

In the diagrams, 1 stands for a single crystal rod of silicon, 2 for a quartz crucible, 3 for a molten mass, 4 for a seed crystal, 5 for a hermetically closed furnace, 6 for an argon gas source, 7 for heating means, 8 for a pulling chuck, 9 for a rotary shaft, 10 and 11 each for a motor, 12 for magnetic field generating means, 13 for an electric current source, and 24 for a convection.

DETAILED DESCRIPTION OF THE INVENTION

This invention concerns a method for pulling up a semiconductor single crystal rod from a molten semiconductor held in a quartz crucible under application of a magnetic field, which method is characterized by fixing the rotational speed of the quartz crucible at a level exceeding 5 rpm and varying the intensity of the magnetic field applied to the molten semiconductor according to the length of pull of the single crystal rod.

This invention attains production of a single crystal of silicon having a higher interstitial oxygen concentration as in the range of from 15 to 20 ppma than is attained by the conventional CZ method by performing the pull of the single crystal under application of a magnetic field (MCZ method) while fixing the rotational speed of the quartz crucible at a level exceeding 5 rpm.

The term "oxygen concentration" as used herein is defined by the following formula:

Oxygen concentration (atoms/cm$^2$) = 3.01 × 10$^{17}$ α

In this formula, α stands for an infarared absorption coefficient (cm$^{-1}$).

The principle responsible for the increase brought about in the interstitial oxygen concentration by the MCZ method at the rotational speed of the crucible above the level of 5 rpm will be discussed below. In consequence of the dissolution of the quartz crucible, the released oxygen is incorporated into the molten silicon and caused to mingle into the single crystal of silicon during the growth thereof The speed at which the quartz crucible is dissolved into the fluid of silicon is believed to depend on the degree with which the surface of the quartz crucible is rubbed by the viscous fluid. The effective kinematic viscosity of an electro-conductive fluid under application of a magnetic field is expressed by the following formula (Kinji Hoshi et al.: Nikkei Electronics, p. 160, September (15, 1980 issue).

$veff = (\mu HD)^2 \sigma / \rho$ wherein veff stands for the effective kinematic viscosity, $\mu$ for the magnetic permeability of a fluid, H for the intensity of a magnetic field, D for the diameter of a crucible, $\sigma$ for the electroconductivity of the fluid, and $\rho$ for the density of the fluid.

The formula indicates that the effective kinematic viscosity of the fluid increases in proportion to the square of the intensity of the magnetic field, H. It is believed that when the value of H increases, the degree of friction produced on the quartz crucible increases proportionately to the consequent increase in the effective kinematic viscosity of the molten silicon, the speed at which the molten silicon dissolves the quartz crucible is heightened, and the oxygen concentration in the single crystal of silicon is consequently larger than when no magnetic field is applied.

Further, this invention requires the intensity of the magnetic field to be varied in accordance with the length of pull of the single crystal. This variation of the magnetic field is a method which unusually abounds in ease of control The reason for the easy control is given below.

Figure 9:
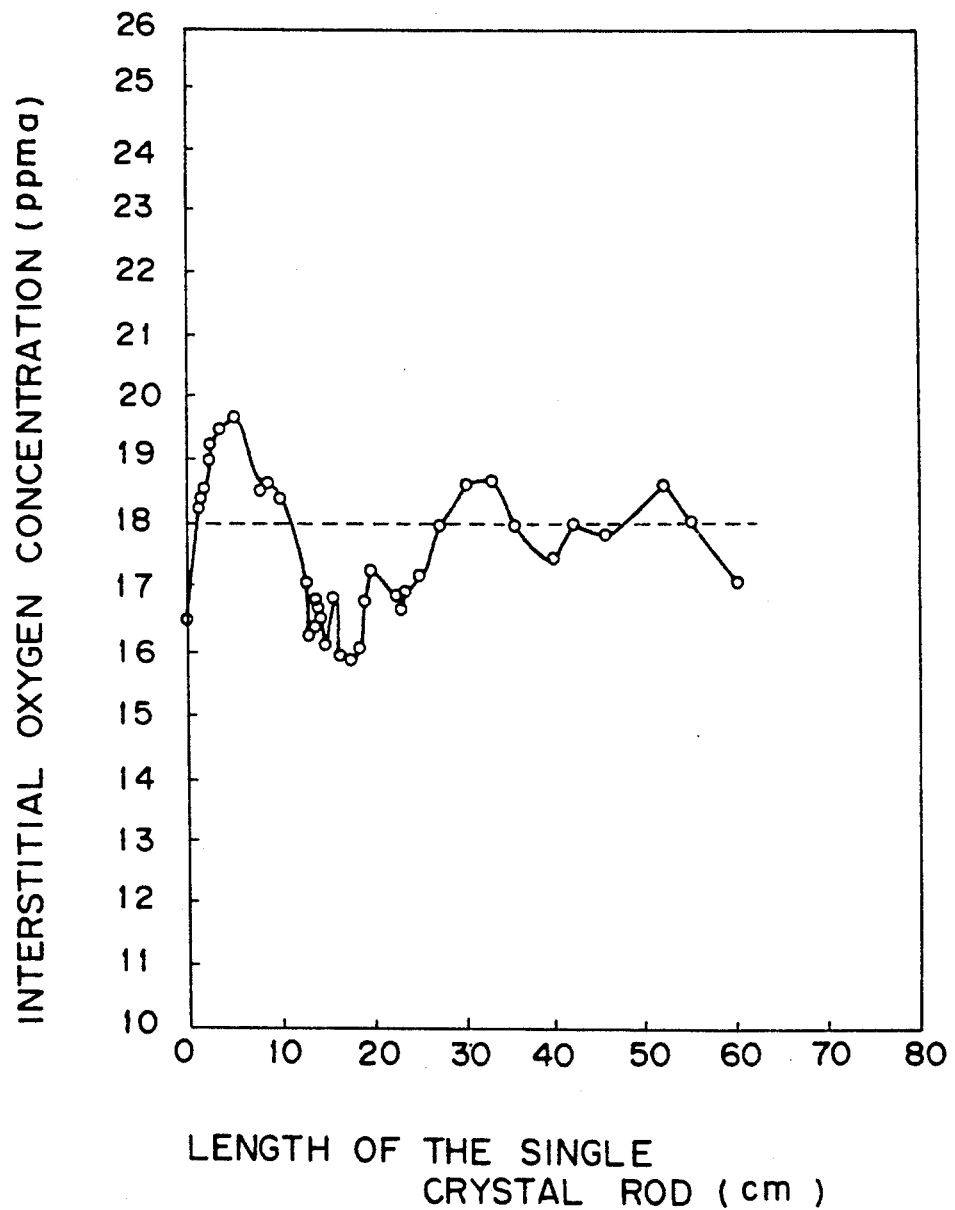
FIG. 9 is a graph showing the distribution of interstitial oxygen concentration in the direction of length of pull of a single crystal rod of silicon obtained by the conventional method which comprises controlling the oxygen concentration by varying the rotational speed of the single crystal rod under application of a magnetic field.

During the pull of the single crystal of silicon in the magnetic field, the oxygen concentration of the single crystal of silicon decreases because the area of contact between the molten silicon and the quartz crucible decreases and the amount of the quartz crucible to be dissolved is gradually decreased with the advance of the pull. The aforementioned method of Japanese Patent Application Disclosure SHO 58(1983)-74,594 has been known to obtain a substantially uniform oxygen concentration throughout the entire length of the single crystal of silicon by gradually increasing the rotational speed of the crucible with the advance of the pull, By this method, however, the oxygen concentration distribution in the single crystal of silicon is not uniform in the axial direction as shown in FIG. 9 This lack of the uniformity of the oxygen concentration distribution may be logically explained by a postulate that since the fluid gains in viscosity in a strong magnetic field, the motion of the fluid is deprived of stationariness during the increase in the rotational speed of the crucible and, as a result, the oxygen distributed thence ununiformly within the fluid is eventually incorporated into the crystal with the elapse of time.

The molten silicon in the crucible assumes an unusually complicate state involving coexistence of such spontaneously arising currents as the thermal convection and the current on the surface of the molten silicon directed from the periphery to the center of the crystal, the forced current due to the rotation of the crucible, and the vortex current resulting from the currents mentioned above. These currents are curbed to some extent by the externally applied magnetic field. When the rotational speed of the crucible is varied as described above, the various currents in the crucible are disturbed and the forced current and the consequently generated vortex current which are forcibly aggravated make more contribution than the spontaneously generated currents such as the convection. Thus, there ensues the uncontrollable state devoid of stationariness.

It, therefore, becomes necessary to impart a stationary current to the fluid and, at the same time, increase the oxygen concentration in the fluid without inducing any variation in the rotational speed of the crucible. The present inventors have found that a single crystal of silicon having an oxygen concentration distributed uniformly in the direction of length of pull of the crystal, with the variation limited in a very narrow range, can be pulled up by varying the intensity of the magnetic field instead of varying the rotational speed of the crucible. This invention has been perfected as a result.

Now, this invention will be described more specifically below with reference to the accompanying drawings.

FIG. 1 schematically illustrates the construction of an apparatus operated for the growth of a semiconductor crystal rod 1 of the present invention.

From an argon gas source 6, argon gas is supplied at a stated flow rate to the interior of a hermetically closed furnace 5. The argon gas is released through a discharge outlet (not shown) as accompanied by the gaseous SiO generated inside the hermetically closed furnace 5. A quartz crucible 2 which is so shaped as to have an opening in the upper side is disposed substantially at the center of the hermetically closed furnace 5. The silicon thermally melted by heating means 7 disposed around the quartz crucible 2 is held as a molten mass 3 in the interior of the quartz crucible 2. A seed crystal 4 of silicon is disposed as held in contact with the surface of the molten mass 3 of silicon. The seed crystal 4 is connected via a pulling chuck 8 to a rotary shaft 9 adapted to be rotated by a motor 10. The rotary shaft 9 is rotated by the motor 10 and, at the same time, pulled up at a fixed low speed by pulling means (not shown). The quartz crucible 2 is rotatably supported on the bottom surface of the hermetically closed furnace 5 and is rotated at a fixed speed (expressed as CR) exceeding 5 rpm, preferably falling in the range of from 5 to 16 rpm by a motor 11.

If the rotational speed is less than 5 rpm, the high oxygen concentration is obtained only with difficulty. If this rotational speed exceeds 16 rpm, the forced current due to the rotation is unduly large and causes turbulence of the molten silicon. Thus, the deviation of the rotational speed from the range specified above entails the possibility that the uniformization of the oxygen concentration and the prevention of lattice defect are jeopardized.

Figure 8:
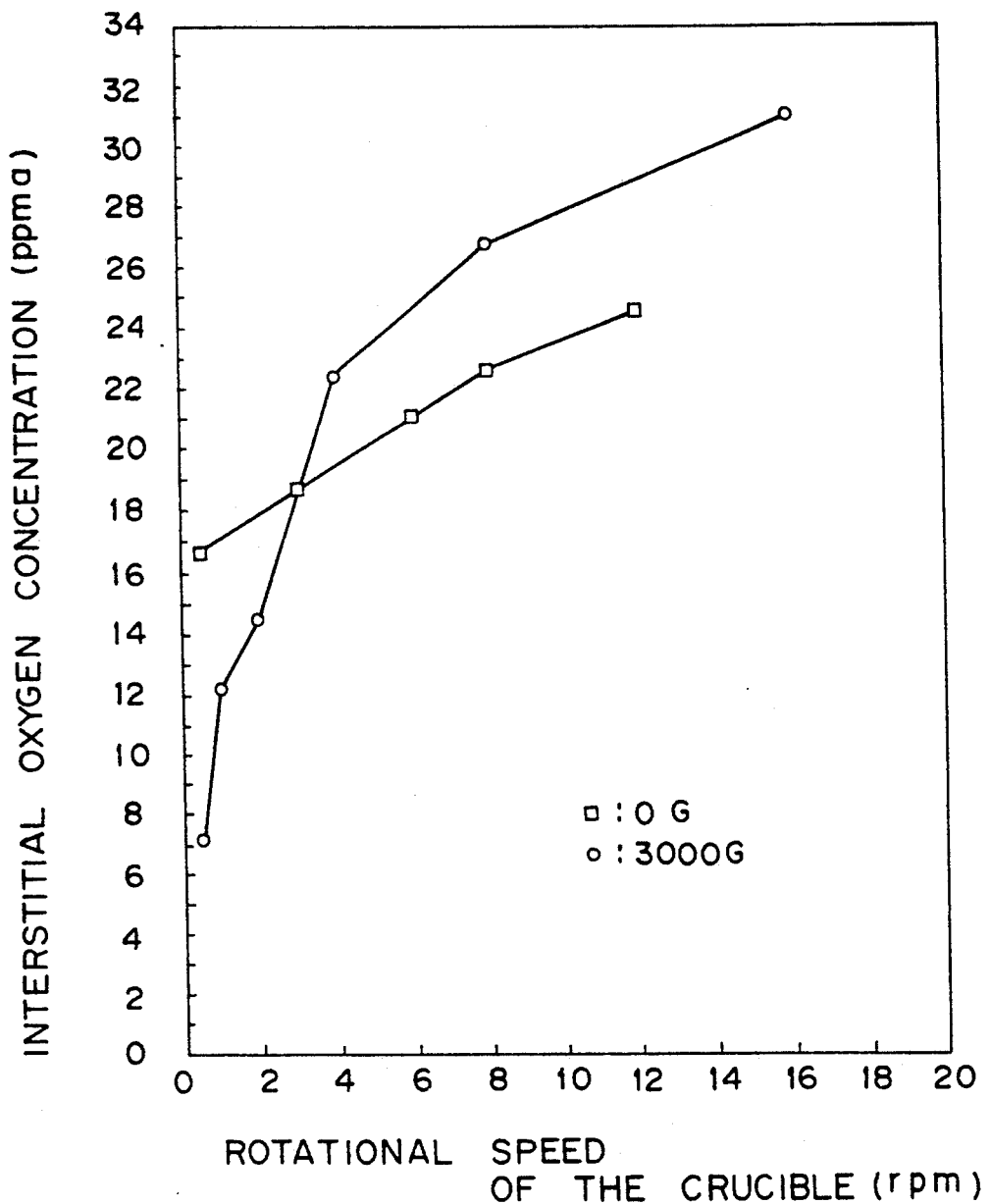
FIG. 8 is a graph showing the relation between the rotational speed of the crucible and the interstitial oxygen concentration in the single crystal rod of silicon, obtained in an operation performed in the absence of a magnetic field and an operation performed under application of a magnetic field of 3,000 gausses.

During the investigation on the relation between the rotational speed of the crucible and the intensity of the applied magnetic field, the inventors obtained data of an operation of pulling up a single crystal of silicon under application of a magnetic field and an operation of effecting the pull in the absence of a magnetic field and plotted the data on the oxygen concentration in the crystal and those on the rotational speed of the crucible to obtain a graph shown in FIG. 8. They have consequently found that the curves of the data of the two operations intersect at the rotational speed of 3 rpm, that when the rotational speed is below 3 rpm, the oxygen concentration is higher in the absence of a magnetic field than in the presence of the magnetic field, and that when the rotational speed exceeds 3 rpm, the oxygen concentration is higher in the presence of the magnetic field than in the absence thereof. The present invention attains the high oxygen concentration by using the rotational speed above the level of 5 rpm which is higher than the critical point of 3 rpm mentioned above.

Outside the hermetically closed furnace 5, magnetic field generating means 12 which is formed as of an electromagnet having the intensity of magnetic field thereof varied by a direct current I is disposed. A current source for feeding the current I to the magnetic field generating means 12 is denoted by reference numeral 13.

Figure 2:
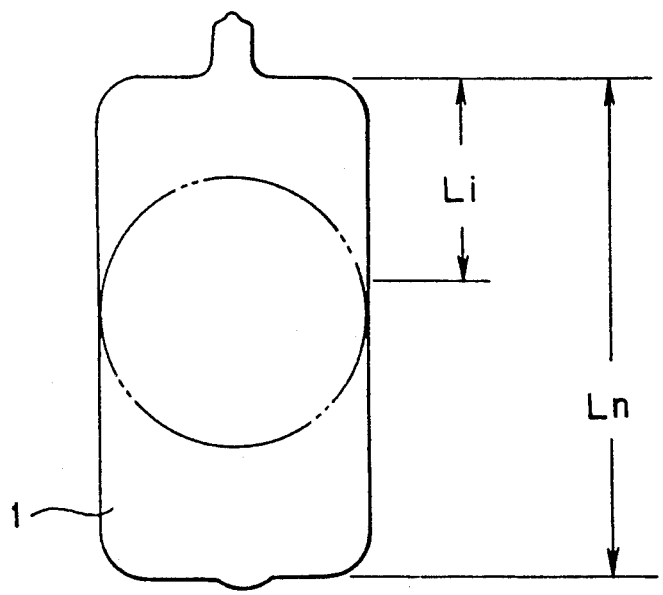
FIG. 2 is a front view illustrating a single crystal rod of silicon formed by the apparatus of FIG. 1.

The single crystal rod 1 of silicon illustrated in FIG. 2 is formed by pulling up the seed crystal 4 held in contact with the surface of the molten mass 3 at a low speed v in the upward direction while keeping the quartz crucible 2 and the seed crystal 4 rotated at a fixed low speed. Since the quartz crucible 2 and the molten mass 3 contact each other on the inner wall of the quartz crucible as illustrated in FIG. 1, friction is produced in the part of this contact and the quartz crucible 2 is rubbed and the oxygen is dissolved into the molten mass 3.

The oxygen which has been dissolved into the molten mass 3 is converted into volatile SiO and is liberated from the molten mass 3 and removed as entrained by the argon gas. The single crystal rod 1 of silicon eventually contains oxygen because the part of the oxygen which escapes being removed in the form of SiO persists in the molten mass 3. Since the oxygen contained in the single crystal rod 1 of silicon consists predominantly of interstitial oxygen, the concentration of the oxygen mingling in the single crystal of silicon can be found substantially by testing the single crystal of silicon for the interstitial oxygen concentration (Oi). Since the amount of the oxygen mingling in the molten mass 3 is directly proportional to the degree with which the inner wall of the quartz crucible 2 is rubbed by the molten mass, it decreases in proportion as the amount of the molten mass of silicon decreases.

Figure 3:
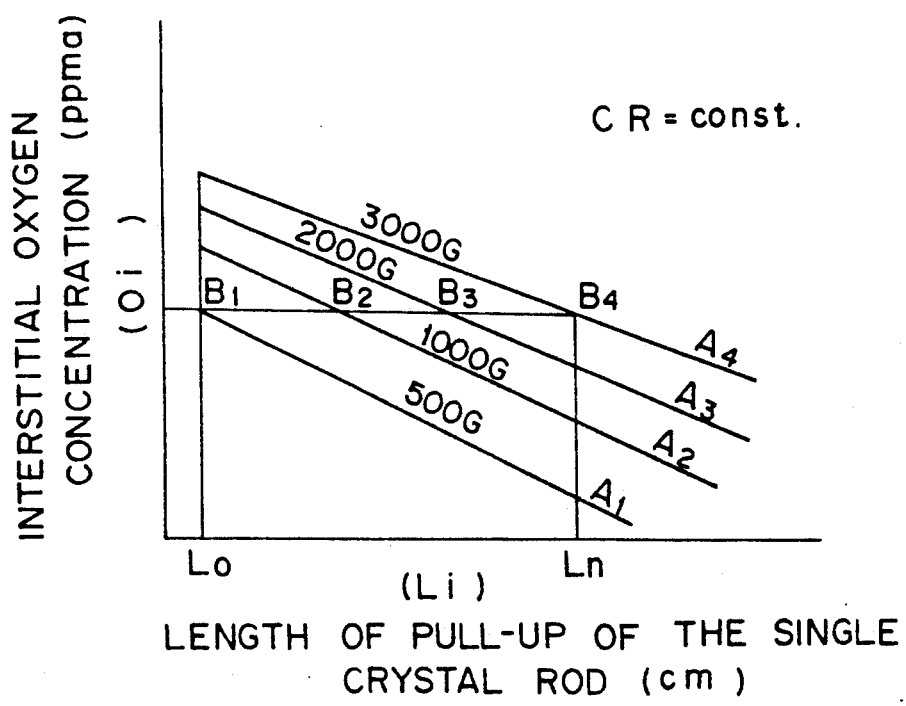
FIG. 3 is a graph showing the relation between the length of pull of a single crystal rod of silicon and the oxygen concentration, with the intensity of magnetic field as a parameter.

When the conditions of the pulling operation are fixed and the length of the single crystal rod 1 of silicon in the direction of pull is represented by Li as illustrated in FIG. 2, the length Li of pull and the interstitial oxygen concentration Oi conceptually assume such a relation as illustrated in the graph of FIG. 3, in which the horizontal axis is the scale of Li and the vertical axis the scale of Oi. It is clearly noted from the substantially rectilinear trends of the graph that the value of Oi decreases in inverse proportion as that of Li increases.

By the magnetic field generating mean 12 disposed around the quartz crucible 2, magnetic force is exerted on the molten mass 3. When the revolutionary speed CR of the quartz crucible 2 is small, the consequent increase in the intensity of the magnetic field curbs the convection 14 generated in the interior of the molten mass 3 and diminishes the dissolution of oxygen from the quartz crucible 2. When the revolutionary speed CR exceeds a certain boundary, the intensity of the magnetic field is increased and, at the same time, the convention is repressed. Owing to the increase in the apparent viscosity due to the applied magnetic field, however, the friction between the inner wall of the quartz crucible 2 and the molten mass 3 is increased and the amount of the oxygen to be dissolved out is conversely increased.

FIG. 3 represents the data of operations using CR's invariably exceeding the aforementioned boundary. The line $A_1$ represents the data of an operation using a magnetic field of 500 Gausses (G), the line $A_2$ those of an operation using a magnetic field of 1,000 gausses (G), the line $A_3$ those of an operation using a magnetic field of 2,000 gausses (G), and the line $A_4$ those of an operation using a magnetic field of 3,000 gausses (G). The line $A_1$ through the line $A_4$ are shifted upwardly. It is clearly noted from the graph that when the magnetic field gains in intensity, the oxygen concentration Oi tends to increase while the slope of the Oi profile is not changed with regard to negativeness (though minor changes of the values of slope themselves are observed).

It is inferred from the data described above that by varying the numerical value of the intensity Gi of the magnetic field according to the variation of Li, the oxygen concentration Oi can be retained at a fixed value as shown in FIG. 3. To be more specific, the oxygen concentration Oi can be retained at a fixed level Oio by fixing the magnitude of magnetic field at 500 gausses falling at the point $B_1$ of intersection when Li is Lo and, as the magnitude of Li increases, varying the intensity of magnetic field gradually to $B_2$ through $B_4$, i.e. the values of 1,000 gausses, 2,000 gausses, and 3,000 gausses.

In this invention, the magnetic field generating means 12 is a horizontal magnetic field and the intensity of this magnetic field is varied in the range of from 500 gausses (G) to 5,000 gausses (G). The reason for the use of the horizontal magnetic field is that the horizontal magnetic field allows direct control of the convection and warrants accurate and quick adjustment of itself.

If the intensity of magnetic field is less than 500 gausses, the convection of the molten mass cannot be effectively curbed. If this intensity exceeds 5,000 gausses, the produced crystal fails to acquire good quality because the apparent viscosity of the molten mass possesses very high viscosity and the molten mass remains in a substantially quiescent state and extremely obstructs stirring by the convection and, as a result, the surface of growth of the crystal is conspicuously concaved relative to the molten mass, thereby the quality of the product being adversely affected. Such intensity of magnetic field possibly manifests adverse effects on the human system and causes troubles in the measuring instruments and the devices operated nearby.

Figure 4:
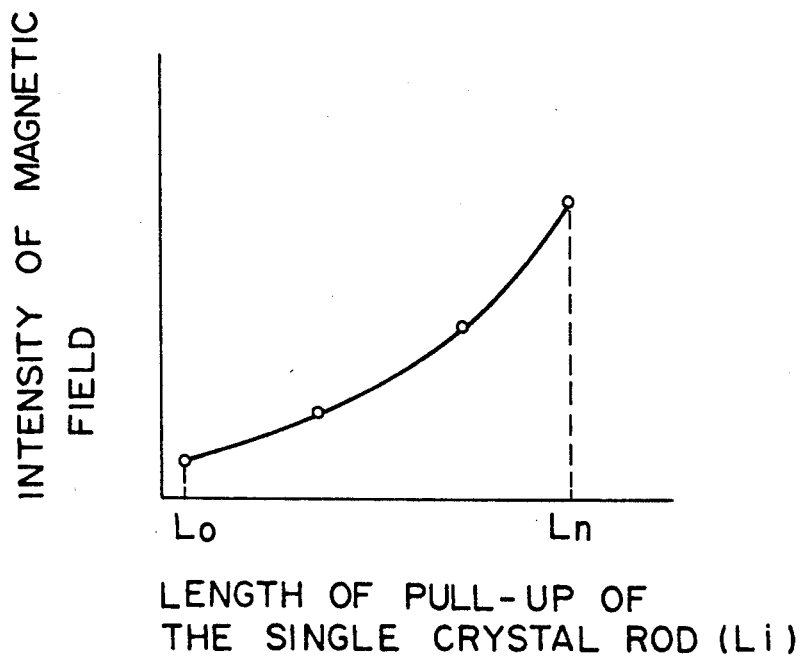
FIG. 4 is a graph showing the relation between the single crystal rod obtained by the pattern on the graph of FIG. 3 and the intensity of magnetic field for uniform axial profile of oxygen concentration.

By drawing a line of Oio on the graph of the data shown in FIG. 3 and plotting the magnitudes of intensity of magnetic field found at the points of intersection relative to the length of pull of the single crystal rod, the graph of FIG. 4 is obtained. By pulling up the single crystal rod in accordance with the pattern of FIG. 4, the produced single crystal rod acquires a fixed oxygen concentration throughout the length from the top to the bottom.

The embodiment described thus far has been aimed at imparting a fixed oxygen concentration to the grown single crystal of silicon. When the production is generalized so that the oxygen concentration forms the function of Li as expressed by the formula, Oi=f(Li), for example, the produced single crystal is allowed to acquire a desired oxygen concentration distribution by drawing a line of Oi=f(Li) on the graph of FIG. 3 in the same manner as described above, finding the points of intersection, plotting the magnitudes of intensity of magnetic field at these points of intersection relative to the length of pull of the single crystal rod, and pulling up the single crystal while varying the intensity of magnetic field in accordance with the length of pull.

Example

Now, the present invention will be described more specifically below with reference to a working example.

Example 1

In the operation of pulling up a single crystal of silicon by the Czochralski method (CZ method), 60 kg of polysilicon was placed in a quartz crucible 18 inches in diameter and melted therein and a single crystal of silicon having a diameter of 6 inches was pulled up in the direction of growth of (100). In this case, the so-called horizontal magnetic field MCZ (HMCZ) method was used. The results of this experiment were as follows.

Figure 5:
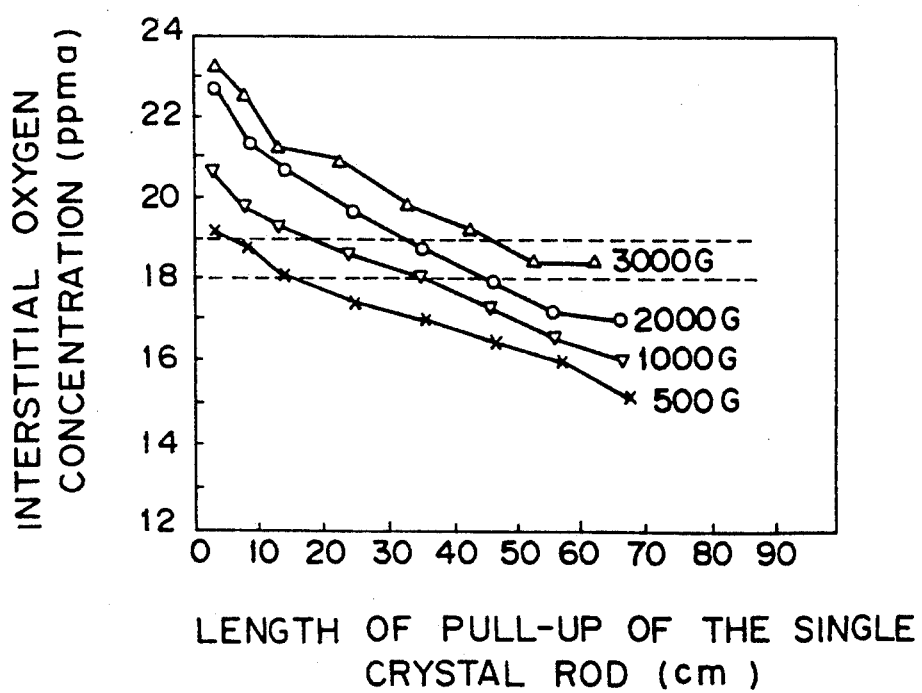
FIG. 5 is a graph showing the relation between the length of pull of the single crystal rod of silicon and the interstitial oxygen concentration obtained in the experiment of working example, with the intensity of magnetic field as a parameter.

FIG. 5 shows the interstitial oxygen concentration in the crystal relative to the intensity of magnetic field obtained in an operation performed under the conditions of 10 rpm of the rotational speed of the crucible and 20 rpm of the rotational speed of the seed crystal. The intensity of the magnetic field was varied between 500 to 3,000 gausses. It is noted from the graph that the oxygen concentration decreased in inverse proportion as the length of pull (ratio of solidification) increased.

Figure 6:
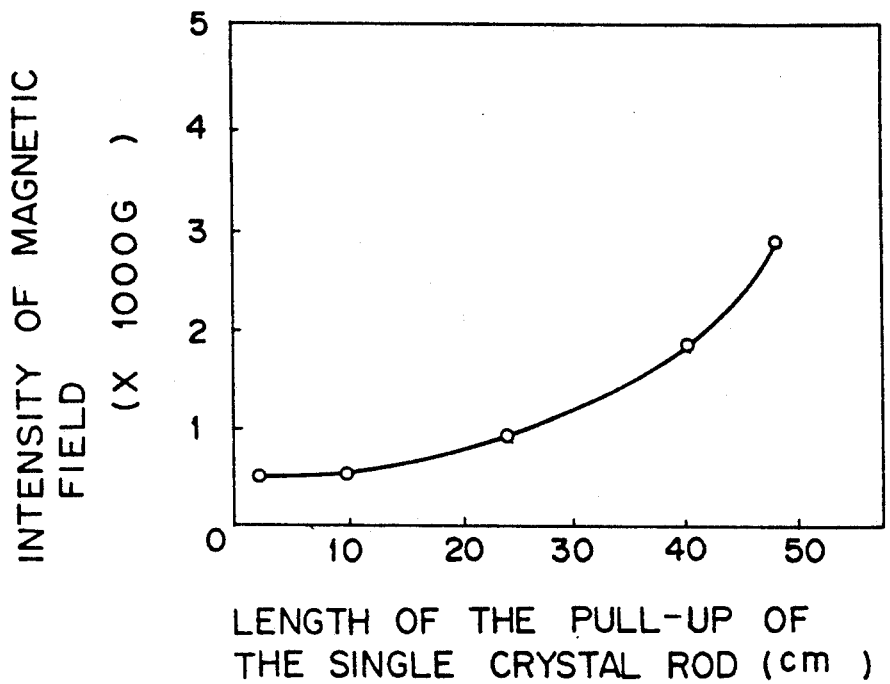
FIG. 6 is a graph showing the relation between the intensity of magnetic field necessary for fixing the oxygen concentration in the range of 18 to 19 ppma and the length of pull of the single crystal rod, obtained in accordance with the pattern drawn on the graph of FIG. 5.
Figure 7:
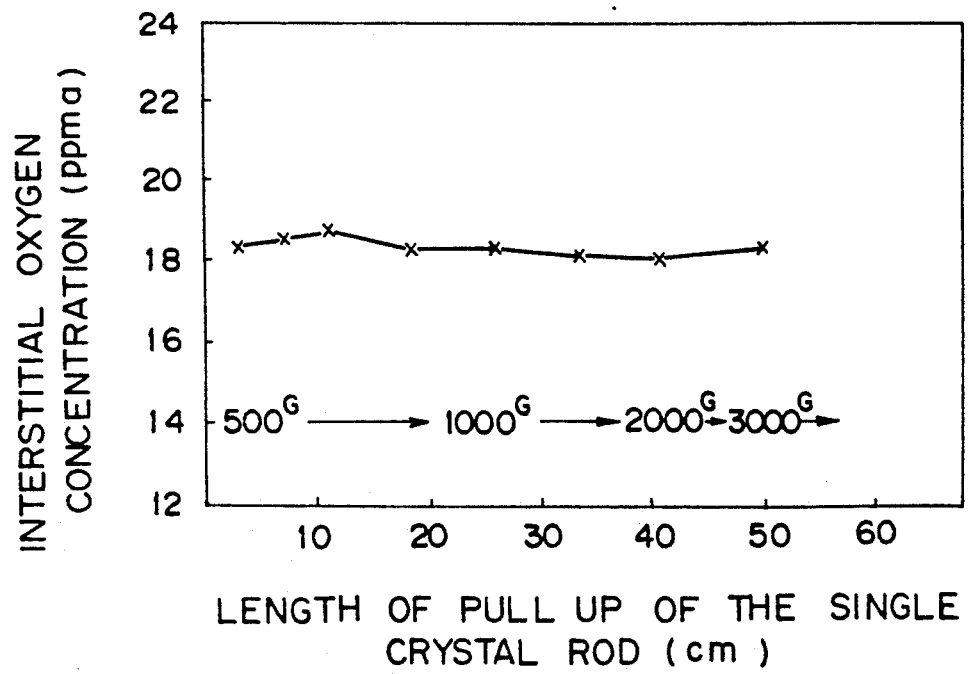
FIG. 7 is a graph showing the relation between the length of pull of the single crystal rod and the interstitial oxygen concentration, obtained by varying the intensity of magnetic field relative to the length of pull in accordance with the pattern drawn on the graph of FIG. 6.

From the graph of FIG. 5, a pattern for varying the intensity of magnetic field with the length of pull so as to fix the oxygen concentration in the range of 18 to 19 ppma was prepared This pattern is shown in FIG. 6. In the actual pulling operation, the intensity of magnetic field was varied with the length of pull as synchronized with the motion of the pull in accordance with the pattern of FIG. 6 memorized in a computer. The results are shown in FIG. 7. In the produced single crystal rod of silicon, the oxygen concentration was generally distributed in the range of 18 to 19 ppma It is clear from the description given thus far that the present invention brings about the following effects.

(1) This invention allows a single crystal rod of silicon to be pulled up with the interstitial oxygen concentration distributed as freely controlled. It, therefore, permits production of a single crystal rod having a uniform interstitial oxygen concentration throughout the entire length thereof, a single crystal rod having a gentler oxygen concentration gradient than the conventional product, and a single crystal rod having a varied oxygen concentration distribution.

(2) This invention permits production of single crystal rods of silicon having generally high oxygen concentrations.

What is claimed is:

1. A method for pulling a semiconductor single crystal rod from a molten semiconductor held in a quartz crucible under application of a magnetic field, which method is characterized by fixing the rotational speed of said quartz crucible at a level exceeding 5 rpm and varying the intensity of said magnetic field applied to said molten semiconductor according to the length of pull of said single crystal rod.

2. A method according to claim 1, wherein said magnetic field is a horizontal magnetic field.

3. A method according to claim 2, wherein the intensity of said horizontal magnetic field is in the range of from 500 to 5,000 gausses.

4. A method according to claim 1, wherein the ratio of variation of magnetic field intensity with regard to time is adjusted in accordance with the gradient of interstitial oxygen concentration in the direction of length of pull of said single crystal rod being pulled.

5. A method for pulling up a semiconductor single crystal rod from a semiconductor melt held in a quartz glass crucible under application of a magnetic field characterized in that the distribution of oxygen mixed into said rod from said crucible is controlled by way of changing the strength of said magnetic field during pulling-up of said crystal rod in order to have an average oxygen density with dispersion of ±5 to ±10% or less from the average density substantially throughtout the length of said rod and that the crucible is rotated at a fixed speed exceeding 5 rpm, wherein the strength of said magnetic field is increased during the crystal growing of said single crystal rod in order to make constant, along the length direction of said rod, the concentration of oxygen mixed into said rod from said crucible and, wherein the strength of said magnetic field is always increased as the crystal is being pulled up.

6. The method according to claim 5, wherein the rotational speed is selected between 5 rpm and 16 rpm.

7. The method according to claim 5, wherein the rate of increasing the strength of the magnetic field is determined in accordance with the relationship among the concentration of oxygen, the length of pulling-up and the magnetic field applied.

8. The method according to claim 5, wherein said magnetic field is induced by a magnetic field generating means whose position is fixed respective to the melt.

9. A method for pulling up a semiconductor single crystal rod from a semiconductor melt held in a quartz crucible under application of a magnetic field, comprising:

disposing the semiconductor melt in said crucible;

heating said semiconductor melt in order to maintain the temperature of said semiconductor melt at an appropriate temperature for growth of single crystal;

supporting a seed crystal in contact with the surface of said semiconductor melt;

applying a magnetic field to said semiconductor melt by means of an electromagnet;

pulling said seed crystal in accordance with the crystal growth;

revolving said quartz glass crucible throughout said pulling step; and increasing an electric current supplied to said electromagnet during said pulling step in order to make constant, along the length direction of said rod, the concentration of oxygen which is mixed into said rod from said crucible, wherein the revolving speed of said crucible is fixed during the pulling step at a prescribed constant speed exceeding 5 rpm.

10. The method according to claim 9, wherein the rate of increasing said electric current is determined in accordance with a relationship among the concentration of oxygen, the length of pulling-up and the magnetic field induced by said electric current.

* * * * *